United States Patent
Adams et al.

(10) Patent No.: US 7,283,411 B2
(45) Date of Patent: *Oct. 16, 2007

(54) FLOOD MODE IMPLEMENTATION FOR CONTINUOUS BITLINE LOCAL EVALUATION CIRCUIT

(75) Inventors: Chad Allen Adams, Byron, MN (US); Derick Gardner Behrends, Rochester, MN (US); Ryan Charles Kivimagi, Chatfield, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/552,791

(22) Filed: Oct. 25, 2006

(65) Prior Publication Data

US 2007/0053231 A1 Mar. 8, 2007

Related U.S. Application Data

(63) Continuation of application No. 10/981,153, filed on Nov. 4, 2004, now Pat. No. 7,133,320.

(51) Int. Cl.
*G11C 7/00* (2006.01)
(52) U.S. Cl. .................. 365/201; 365/154; 365/203
(58) Field of Classification Search ................ 365/154, 365/201, 185.13, 203
See application file for complete search history.

(56) References Cited

U.S. PATENT DOCUMENTS

| | | | |
|---|---|---|---|
| 6,275,427 B1 | 8/2001 | Aipperspach et al. | |
| 6,643,804 B1 | 11/2003 | Aipperspach et al. | |
| 6,657,886 B1 | 12/2003 | Adams et al. | |
| 6,728,912 B2 | 4/2004 | Dawson et al. | |
| 6,741,493 B1* | 5/2004 | Christensen et al. | 365/154 |
| 6,901,003 B2 | 5/2005 | Adams et al. | |
| 7,133,320 B2* | 11/2006 | Adams et al. | 365/201 |

* cited by examiner

*Primary Examiner*—Tuan T. Nguyen
*Assistant Examiner*—Alexander Sofocleous
(74) *Attorney, Agent, or Firm*—Stephen J. Walder, Jr.; Diana R. Gerhardt (57) ABSTRACT

A method, an apparatus, and a computer program product are provided for flood mode implementation of SRAM cells that employ a continuous bitline local evaluation circuit. Flood mode testing is used to weed out marginal SRAM cells by stressing the SRAM cells. Flood mode is induced by beginning with a normal write operation. After new data values have been forced into the SRAM cells, then the write signal is chopped off. A delay block keeps the wordline signal at the high supply, and the SRAM cells go into flood mode. At this juncture marginal cells can be easily detected and later mapped to redundant cells.

20 Claims, 6 Drawing Sheets

FLOOD MODE IMPLEMENTATION FOR CONTINUOUS BITLINE LOCAL EVALUATION CIRCUIT

This application is a continuation of application Ser. No. 10/981,153, filed Nov. 4, 2004, now U.S. Pat. No. 7,133,320 status awaiting publication.

FIELD OF THE INVENTION

The present invention relates generally to flood mode testing of SRAM cells, and more particularly, to flood mode testing of SRAM cells, which use a continuous bitline approach to read/write the cells.

DESCRIPTION OF THE RELATED ART

Flood mode testing is used to weed out marginal Static Random Access Memory (SRAM) cells in an array. Marginal SRAM cells are memory cells that are weak and unstable. These unstable cells can cause inaccurate reads and/or writes of the specific array. Flood mode testing involves stressing the cell to a condition that is worse than what could be found in normal test operations. This makes the marginal cells easy to detect. Once the marginal cells are found, then the functional cells can be mapped to the spare or redundant cells in the array. This testing eliminates potential failures in the design; downstream in the manufacturing flow, or worse yet, in the consumer product.

Figure 1:
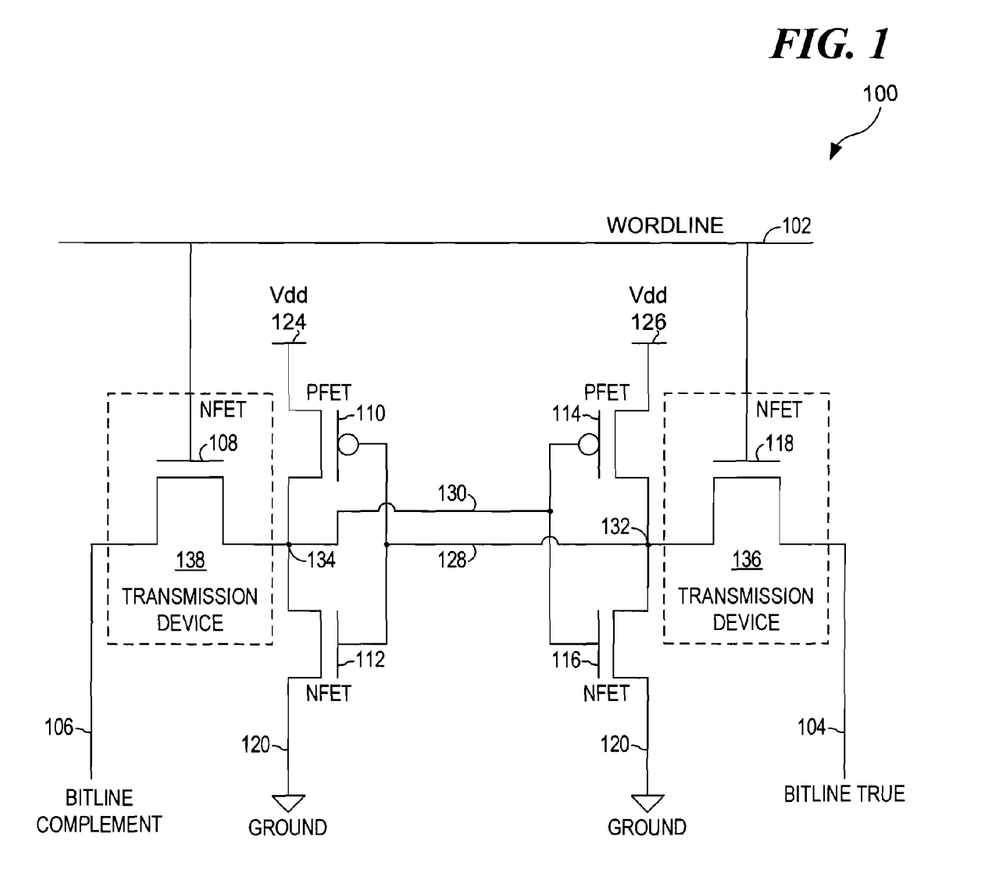
FIG. 1 is a conventional Static Random Access Memory (SRAM) cell.

SRAM cells are used to store bits of data. A bit once written in a SRAM cell stays there until rewritten or until the power of the cell is turned off. Referring to FIG. 1 of the drawings, the reference numeral 100 generally designates a conventional SRAM cell. The wordline 102 is connected to the gates of two N-Channel Field Effect Transistors (nFET) 108 and 118. The drain of nFET 118 is the bitline true 104, while the source is connected to node 132. The nFET 118 is the transmission device 136, which when activated by wordline 102 transmits the value of node 132 onto the bitline true 104 in read mode, and transmits the value of bitline true 104 to node 132 in write mode. The drain of another nFET 116 is connected to the node 132. The source of nFET 116 goes to ground 120, and the gate of nFET 116 is connected to the gate of a P-Channel Field Effect Transistor (pFET) 114. The drain of this pFET 114 goes to power supply Vdd 126. The source of pFET 114 is connected to the node 132, also. This makes up one half of the SRAM cell.

The source of nFET 108 is the bitline complement 106. The drain of nFET 108 is connected to node 134. The nFET 108 is the transmission device 138, which when activated by wordline 102 transmits the value of node 134 onto the bitline complement 106 in read mode, and transmits the value of bitline complement 106 to node 134 in write mode. Another nFET 112 has its source connected to node 134. The drain of nFET 112 goes to ground 120, and the gate of nFET 112 is connected to the gate of a pFET transistor 110. The source of pFET 110 is connected to power supply Vdd 124, and the drain of pFET 110 is connected to the node 134. One line of wire 130 connects node 134 to the gates of nFET 116 and pFET 114. Alternatively, another wire 128 connects node 132 to the gates of nFET 112 and pFET 110.

Figure 2:
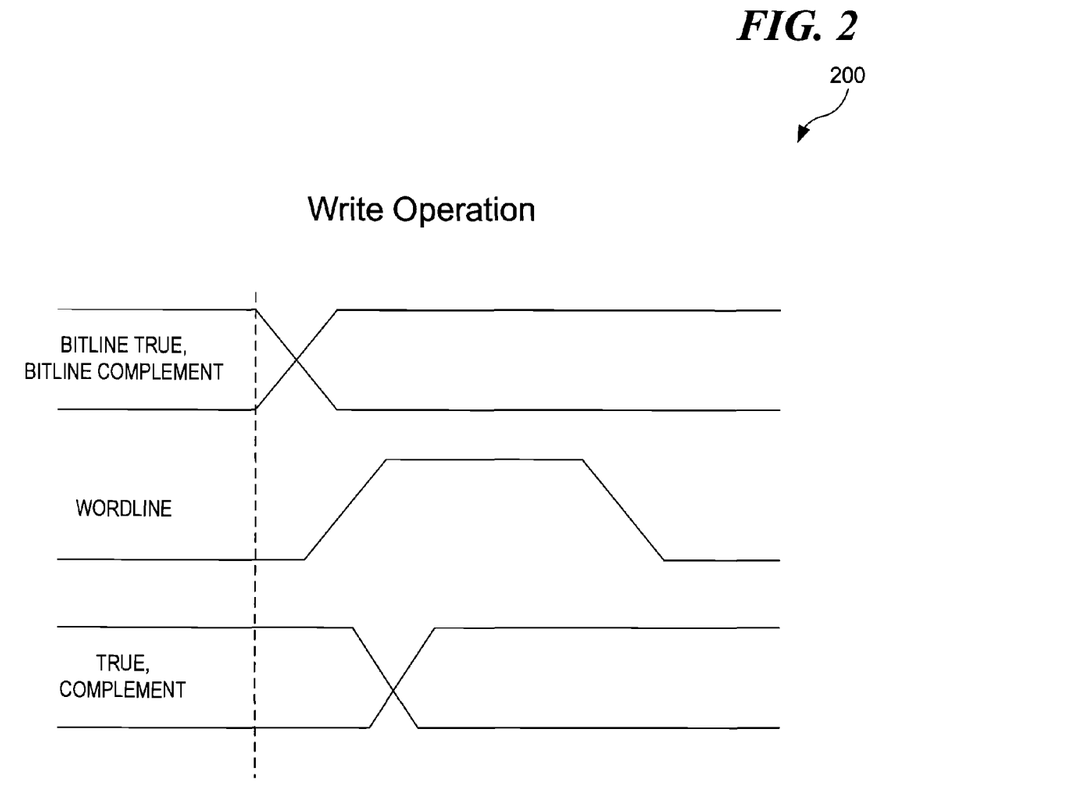
FIG. 2 is a timing diagram illustrating a write operation in an SRAM cell.

An SRAM cell can be used to read bits from the cell or write bits into the cell. After a flood mode cycle, the read operation is used to detect the marginal cells. However, the read operation is not used to induce the flood mode cycle, so it will not be described in this disclosure. The write operation is integral to flood mode testing and must be understood. Referring to FIG. 2 of the drawings, the reference numeral 200 depicts a timing diagram illustrating the write operation in a conventional SRAM cell. The process begins with precharging the bitline true 104 to a level, typically the high supply. On the timing diagram 200, the bitline true 104 begins at the high supply and the bitline complement 106 begins at the low supply. After the bitlines 104 and 106 are precharged the write driver is activated, which forces bitline true 104 to the low supply and the bitline complement 106 to the high supply. This is indicated in the timing diagram 200 by the change in levels. Next the wordline 102 pass devices and a driver are activated to force new data into the SRAM cell. This step is depicted in the timing diagram 200 by the rise of the wordline 102 to the high supply. Directly after that with a small time delay, the true and complement nodes in the SRAM cell are potentially forced to new levels. The true and complement lines illustrate the switching of the internal nodes of the SRAM cell. The next step in the process involves turning off the wordline 102 pass devices and driver, which moves the wordline to the low supply. The last step in the write operation is powering on the bitline precharge devices again to prepare for another write operation. Overall, when the write is activated, the bitlines 104 and 106 engage to write the SRAM cell to either a "1" or a "0", thus updating the value of the SRAM cell.

Conventional methods of flood mode testing use the write operation to induce flood mode, which stresses the marginal cells. SRAM cells that are properly functioning do not show this stressed condition. As previously described, this flood mode testing insures a stress condition of the marginal cells that is more easily detected than under normal test operations. This makes it simple to weed out the marginal cells. Once the marginal cells are weeded out, then they can be mapped to spare or redundant cells in the array.

SUMMARY OF THE INVENTION

The present invention provides a method, an apparatus, and a computer program product for flood mode implementation for SRAM cells that employ a continuous bitline local evaluation circuit. Flood mode testing consists of stressing the SRAM cells of an array so that the marginal SRAM cells can be easily detected. With the new implementation of the continuous bitline in local evaluation circuits a new method of flood mode testing is needed.

This invention achieves flood mode testing by beginning with a normal write operation for the specific SRAM cells. After the write operation has forced new data values into the SRAM cells, the write signal is chopped off. A delay block is used to keep the wordline signal high after the write signal is chopped off, which initiates flood mode. The SRAM cells become stressed and marginal SRAM cells with a low data value try to return to the high supply. The marginal SRAM cells are easy to detect at this juncture and can later be mapped to redundant cells.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

Flood mode testing recognizes that an SRAM cell designed in Silicon On Insulator (SOI) technology is in its least stable condition immediately after a write operation. If a memory cell has been in a state for a while, the body voltages go to values consistent with that state. Thus, the cell favors the previous state for a number of cycles after it has been written to another state. Processing defects can affect the symmetry of the cell and cause one state to be favored over the other. These defects may be such that the cell disruption is only possible when the cell is in the "just written" condition. Further, the time that the cell is affected by the defect induce asymmetry will have frequency dependency. In many cases the test operation is required to be run at very high frequency, which may be difficult for wafer type testers. Because of this phenomenon, conventional testing alone may not be able to detect these marginal cells.

A continuous bitline local evaluation circuit was designed to evaluate a group of SRAM cells in an array. The previous flood mode testing was done with SRAM cells that did not incorporate a continuous bitline. The continuous bitline approach is an SRAM cell design that replaced the two bitlines (bitline true 104 and bitline complement 106) with one bitline true and a continuous bitline. The continuous bitline is wired to a group of the SRAM cells in an array and only connects to one side of the SRAM cells. The advantages of the continuous bitline approach are less wiring, higher performance, and less noise. Due to the new continuous bitline approach, a new method of flood mode testing was needed to weed out marginal cells. Previous methods of flood mode testing were not effective at implementing this, because they did not take into account the continuous bitline in a dynamic bitline approach.

Figure 3:
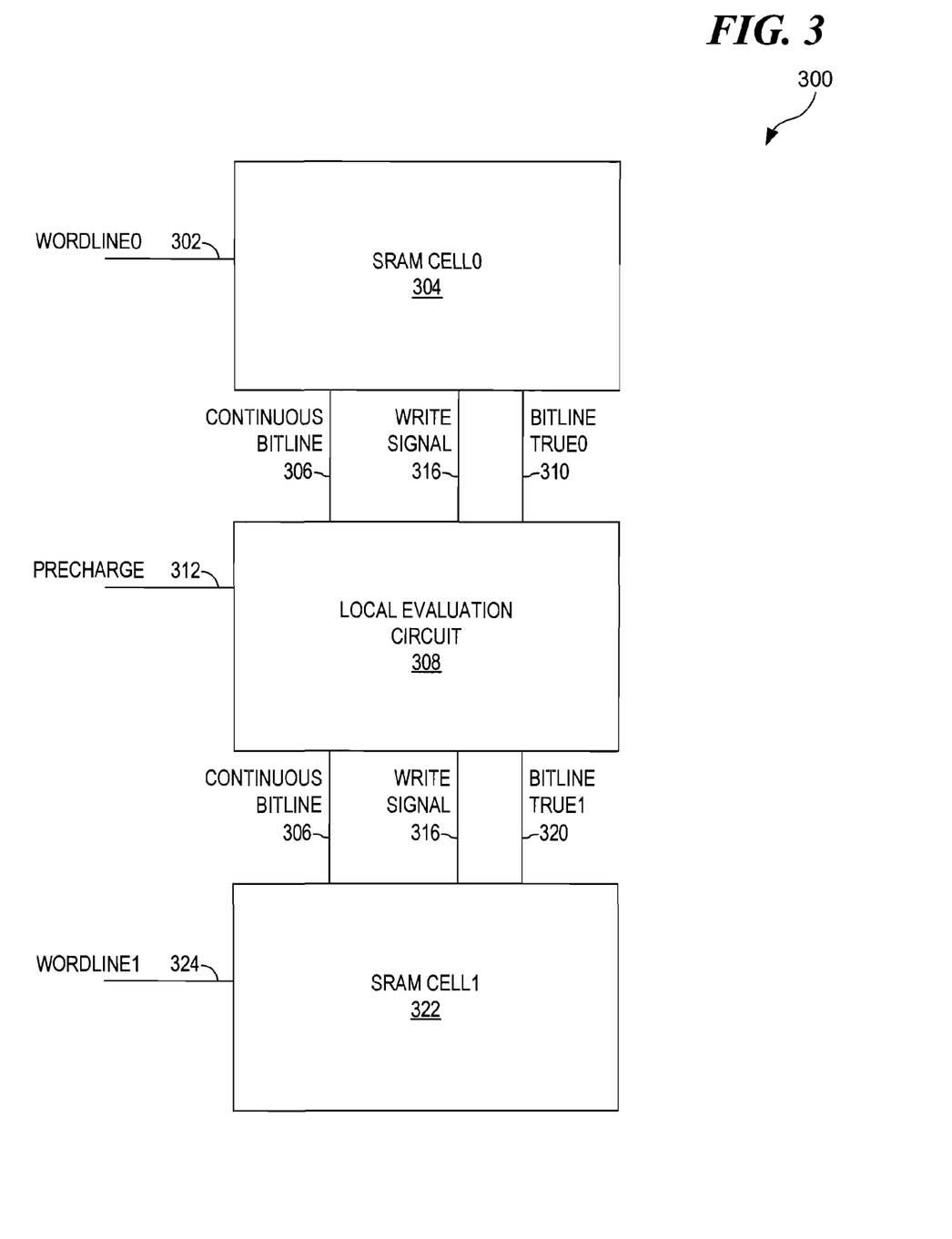
FIG. 3 is a block diagram illustrating the continuous bitline approach in local evaluation circuit design.

Referring to FIG. 3 of the drawings, reference numeral 300 depicts a block diagram illustrating the continuous bitline approach in local evaluation circuit design. SRAM Cell0 304 and SRAM Cell1 322 are memory cells that exist in an array. These SRAM cells 304 and 322 correspond to reference numeral 100 in FIG. 1, but with the bitline true 104 and the bitline complement 106 combined into one bitline (bitline true0 310 or bitline true1 320) and a continuous bitline 306. The local evaluation circuit 308 is designed to write or read data to or from the SRAM cells 304 and 322.

The continuous bitline 306 is connected to the local evaluation circuit 308 and all of the other SRAM cells in an array. FIG. 3 illustrates that the continuous bitline 306 is connected to SRAM cells 304 and 322. The continuous bitline 306 is used to pull down the bitline signals 310 and 320 from the SRAM cells. The bitline true0 310 is connected to the local evaluation circuit 308 and provides the data value of SRAM cell0 304. The bitline true1 320 is connected to the local evaluation circuit 308 and provides the data value of SRAM cell1 322. Wordline0 302 provides the signal that controls the read and write operations of SRAM Cell0 304. Wordline1 324 provides the signal that controls the read and write operations of SRAM Cell1 322. These wordlines 302 and 324 correspond to reference numeral 102 in FIG. 1. The local evaluation circuit 308 must have a precharge signal 312 and a write signal 316 as inputs. The precharge signal 312 is used to precharge the bitlines before a read or write operation. The write signal 316 is used to read or write to the particular SRAM cells 304 and 322.

Figure 4:
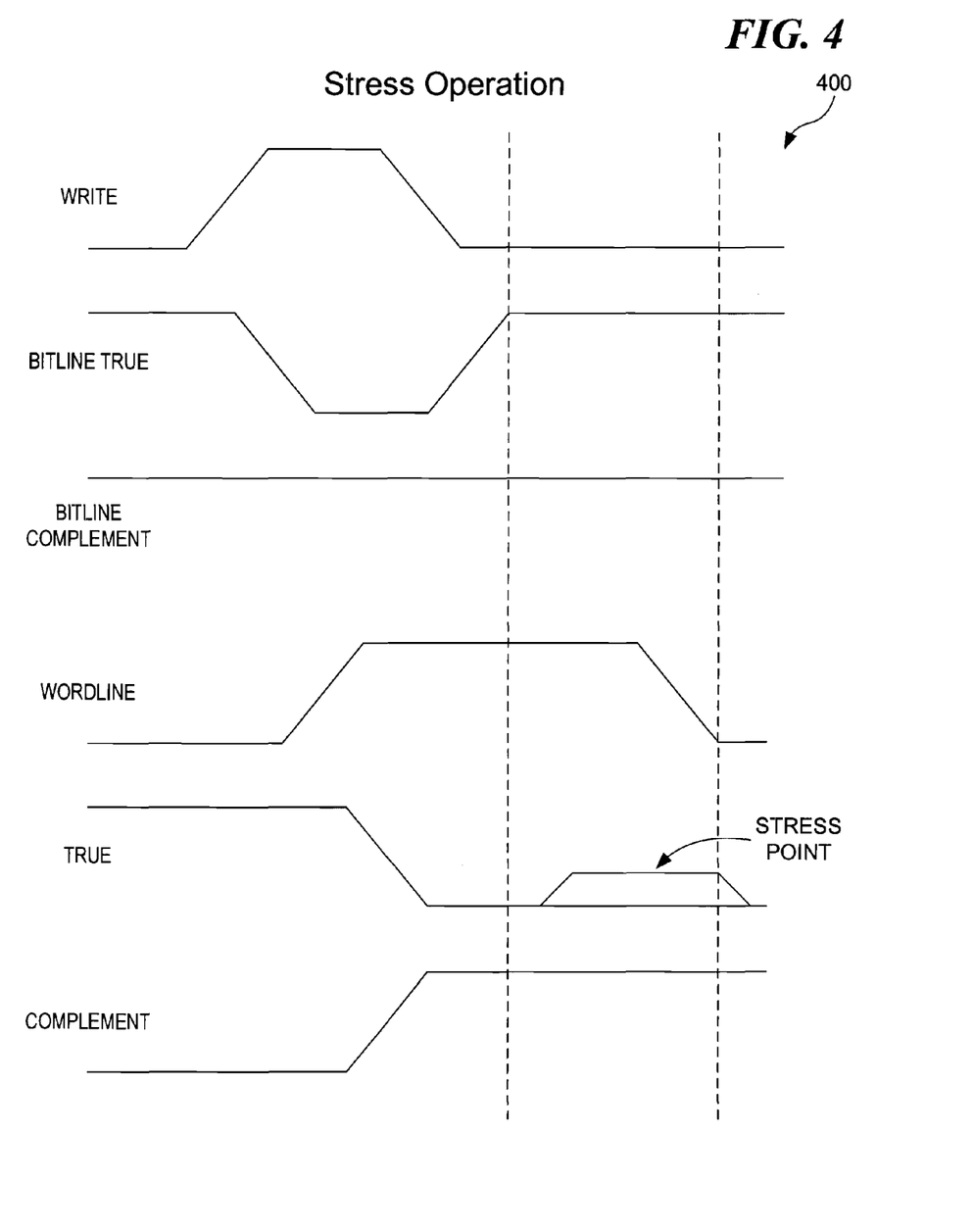
FIG. 4 is a timing diagram illustrating a modified flood mode stress operation in an SRAM cell, which uses a continuous bitline approach to read/write to the cell.

Referring to FIG. 4 of the drawings, reference numeral 400 is a timing diagram illustrating a modified flood mode stress operation in an SRAM cell, which uses a continuous bitline approach to read/write to the cell. This flood mode cycle is accomplished by starting with a write mode operation 200, and then chopping off the write signal 316 before the wordline 302 or 324 returns to the low supply. This modified stress operation begins with the write signal 316 going to the high supply. This forces the bitline true 310 or 320 to go to the low supply. Subsequently, the wordline signal 302 or 324 is forced to the high supply. This forces new data values into the SRAM cells 304 or 322, just like a normal write operation (FIG. 2). This is depicted by the true and complement lines switching data values. Then, the write signal 316 is chopped off, which forces the bitline true 310 or 320 to the high supply. The wordline 302 or 324 remains at the high supply, which causes flood mode of the SRAM cell. The SRAM cell is flooded with charge at the time the body voltages are at their absolute worst case values. The stress point is shown in FIG. 4 as the true line (value of the SRAM cell) tries to return to the high supply. If a marginal SRAM cell has a data value of "0," then it will show this stress condition. This stress condition is caused because the marginal SRAM cells want to go to the high supply due to the charge of the cell. In turn, marginal cells can be detected by this stress condition, and removed from the device. This stress condition of the weakened cells is worse then what could be found in normal test operations.

Conventional flood mode testing uses a sense amp design, consisting of two bitlines used to read, and sense the array. Two bitlines were needed because there is a bitline true signal and a bitline complement signal. This modified flood mode testing uses a sense amp design, consisting of one continuous bitline 306, and an additional write bitline signal 316.

Figure 5:
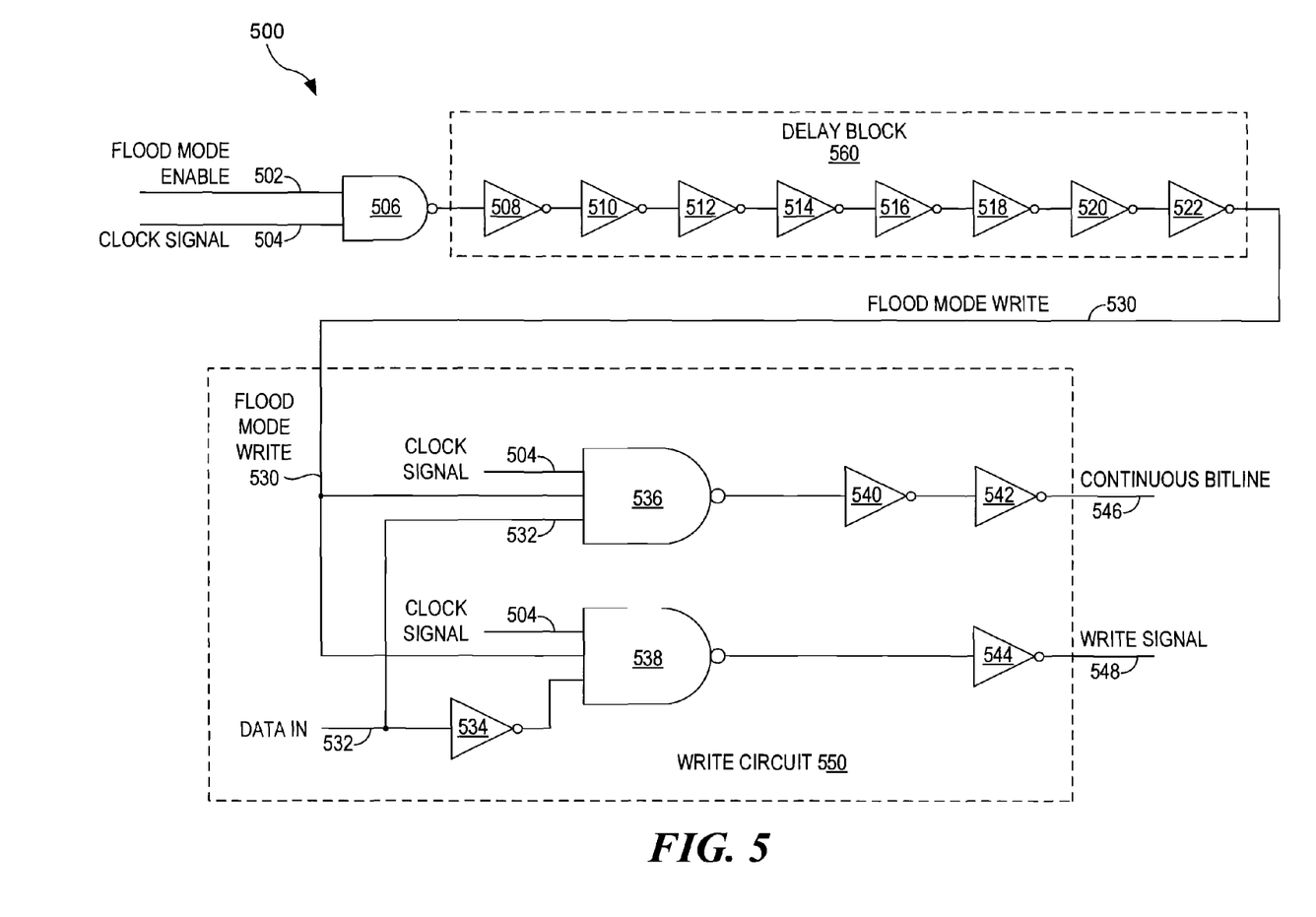
FIG. 5 schematically depicts a circuit that is designed to induce the flood mode stress operation in an SRAM cell.

Referring to FIG. 5 of the drawings, reference numeral 500 generally designates the circuit that is designed to induce the flood mode stress operation in an SRAM cell. This circuit 500 consists of two smaller circuits. One circuit is designed to delay the wordline signal 302 or 324 and produce the flood mode cycle. This delay circuit is connected to a write circuit 550 that controls the read and write operations of the SRAM cells. A flood enable signal 502 that enables the flood mode cycle is input into the circuit 500. The flood enable signal 502 and a clock signal 504 are inputs of a NAND gate 506. The output of NAND gate 506 feeds an inverter 508. Eight inverters 508, 510, 512, 514, 516, 518, 520, and 522, connected in series make up the delay block 560, which causes the delay that produces the flood mode cycle. The time delay of these inverters causes the wordline 302 or 324 to remain high for a period of time after the write signal 316 is chopped off. The delay block 560 can consist of any number of logical gates. If more inverters are added to the delay block 560, then the wordline 302 or 324 remains high for a longer period of time. The delay block 560 is used to control the length of the flood mode. The output of inverter 522 is the flood mode write signal 530.

The flood mode write signal 530 is then fed into the write circuit 550 having two, three-input NAND gates 536 and. The inputs to NAND gate 536 are the clock signal 504, a data in signal 532, and the flood mode write signal 530. The inputs to NAND gate 538 are the clock signal 504, the complement of the data in signal 532, and the flood mode write signal 530. An inverter 534 is connected to the data in signal 532 to provide the complement of the data in signal 532. The output of NAND gate 536 is fed into an inverter 540. This inverter 540 is connected to another inverter 542. The output of inverter 542 is the continuous bitline signal 546, which corresponds to reference numeral 306 of FIG. 3. The output of NAND gate 538 is fed into inverter 544. The output of inverter 544 is the write signal 548, which corresponds to reference numeral 316 of FIG. 3.

Overall, when this circuit 500 is put into flood mode, it executes a normal write operation, and then at a time determined by delay block 560 forces off the write operation. The wordline 302 or 324 remains high, forcing the array into flood mode. During the flood mode cycle the flood mode write signal 530 inputs a "0" into the NAND gates 536 and 538, which turns these NAND gates off. When the NAND gates are turned off, the continuous bitline 546 goes to Vdd and the write signal 548 goes to ground, and the flood mode cycle begins.

Figure 6:
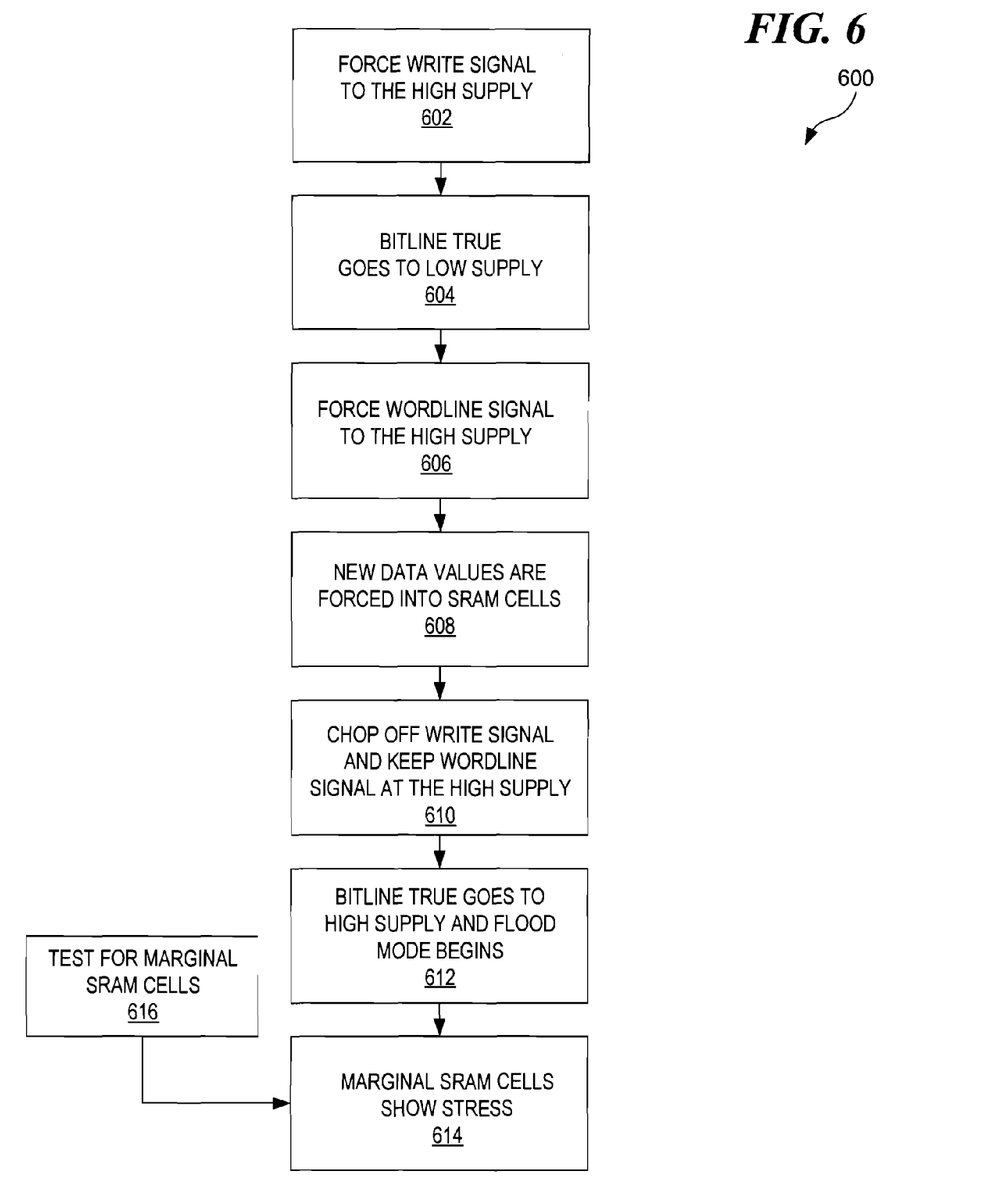
FIG. 6 is a flow chart illustrating the process of forcing an SRAM cell into flood mode.

Referring to FIG. 6, reference numeral 600 is a flow chart illustrating the process of forcing an SRAM cell into flood mode. The process begins in step 602 by forcing the write signal to the high supply. After the write signal goes to the high supply in step 602, the bitline true goes to the low supply in step 604. Subsequently, the wordline signal is forced to the high supply in step 606. When the wordline signal goes to the high supply in step 606, new data values are forced into the SRAM cells in step 608. Then, in step 610, the write signal gets chopped off and the wordline remains at the high supply. The delay block 560 is implemented to keep the wordline high. This forces the bitline true to the high supply and flood mode begins in step 612. In flood mode the marginal SRAM cells in the array show stress in step 614. When the marginal SRAM cells show stress in step 614, it is easy to test for the marginal SRAM cells in step 616. After the marginal cells are detected, they can be mapped to redundant cells in the array.

This process is needed to detect marginal SRAM cells. If marginal cells are not are not detected at test time, then the specific device does not produce a reasonable yield. Due to a new continuous bitline approach to local evaluation circuits, a new flood mode testing method was needed, and this invention provides exactly that.

It is understood that the present invention can take many forms and embodiments. Accordingly, several variations of the present design may be made without departing from the scope of the invention. The capabilities outlined herein allow for the possibility of a variety of programming models. This disclosure should not be read as preferring any particular programming model, but is instead directed to the underlying concepts on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A method for flood mode testing of at least one of a plurality of Static Random Access Memory (SRAM) cells, comprising:
   establishing a single continuous bitline;
   entering at least one of the plurality of SRAM cells into a write mode by using the continuous bitline;
   writing to at least one of the plurality of SRAM cells;
   placing at least one of the plurality of SRAM cells in a flood mode after at least one of the plurality of SRAM cells has been written to;
   precharging the continuous bitline in response to the flood mode; and
   leaving a wordline signal high after the continuous bitline has begun to be precharged.

2. The method of claim 1, wherein establishing a single continuous bitline, further comprises wiring a line on one side of at least two of the plurality of SRAM cells in an array to connect the SRAM cells.

3. The method of claim 1, wherein establishing a single continuous bitline, further comprises connecting the continuous bitline to a local evaluation circuit, which is at least configured to control the operations of at least one of the plurality of SRAM cells in an array.

4. The method of claim 1, wherein entering at least one of the plurality of SRAM cells into a write mode and writing to at least one of the plurality of SRAM cells, by using the continuous bitline, further comprises:
   precharging the continuous bitline;
   activating at least one write driver, which is at least configured to assert a write signal after the continuous bitline is precharged;
   asserting a wordline signal after the write signal is asserted; and
   forcing new data into at least one of the plurality of SRAM cells in response to the wordline signal.

5. The method of claim 1, wherein placing at least one of the plurality of SRAM cells in a flood mode, further comprises implementing an enabling circuit that can at least enable flood mode in at least one of the plurality of SRAM cells.

6. The method of claim 1, wherein leaving the wordline signal high, further comprises implementing a delay block that at least forces the wordline signal to stay high after the continuous bitline has begun to be precharged.

7. The method of claim 1, wherein placing at least one of the plurality of SRAM cells in the flood mode induces a stress on one or more marginal SRAM cells in the at least one of the plurality of SRAM cells causing the one or more marginal SRAM cells to attempt to return to a high supply state, and wherein the one or more marginal SRAM cells are detected by detecting the stress induced on the one or more marginal SRAM cells as a result of the flood mode.

8. The method of claim 7, further comprising mapping the detected one or more marginal SRAM cells to redundant SRAM cells.

9. The method of claim 1, wherein placing the at least one of the plurality of SRAM cells in a flood mode comprises inputting a flood mode write signal to a first NAND gate, and wherein the first NAND gate outputs a continuous bitline signal to the at least one of the plurality of SRAM cells.

10. The method of claim 9, wherein placing the at least one of the plurality of SRAM cells in a flood mode further comprises inputting the flood mode write signal to a second NAND gate, and wherein the second NAND gate outputs a write signal to the at least one of the plurality of SRAM cells.

11. An apparatus for flood mode testing of at least one of a plurality of Static Random Access Memory (SRAM) cells in an array, comprising:
   a continuous bitline connecting at least two of the plurality of SRAM cells;
   a local evaluation circuit that is connected to the continuous bitline and is at least designed to control the operations of at least one of the plurality of SRAM cells;
   a flood mode enabling circuit that is at least configured to induce at least one of the plurality of SRAM cells into flood mode; and
   a write circuit connected to the flood mode enabling circuit that is at least configured to control the write operation of at least one of the plurality of SRAM cells.

12. The apparatus of claim 11, wherein the continuous bitline connecting at least two of the plurality of SRAM cells, further comprises a line of wire connected to one side of at least two of the plurality of SRAM cells in an array.

13. The apparatus of claim 11, wherein the flood mode enabling circuit, further comprises a delay block that is at least configured to leave a wordline signal high for a specified period of time after the continuous bitline has begun to be precharged.

14. The apparatus of claim 11, wherein the write circuit is at least configured to receive a flood mode write signal from the flood mode enabling circuit, a clock signal, and a data in signal as inputs and produce the continuous bitline and a write signal as outputs.

15. The apparatus of claim 11, wherein the flood mode enabling circuit comprises a NAND gate that receives a flood mode enable signal input and a clock signal input and outputs a flood mode enable signal to a delay block.

16. The apparatus of claim 15, wherein the delay block is comprised of a plurality of inverters coupled to one another in series.

17. The apparatus of claim 16, wherein a number of the plurality of inverters is selected to achieve a specified period of time in which a wordline signal is left high after the continuous bitline has begun to be precharged, with larger numbers of inverters causing the specified period of time to be greater than for smaller numbers of inverters.

18. The apparatus of claim 11, wherein the write circuit comprises a first NAND gate that receives a flood mode write signal from a delay block, and wherein the first NAND gate outputs a continuous bitline signal to the at least one of the plurality of SRAM cells.

19. The apparatus of claim 18, wherein the write circuit further comprises a second NAND gate that receives the flood mode write signal from the delay block, and wherein the second NAND gate outputs a write signal to the at least one of the plurality of SRAM cells.

20. An apparatus, comprising:
   one or more Static Random Access Memory (SRAM) cells;
   a delay block; and
   a write circuit coupled to the delay block and the one or more SRAM cells, wherein the delay block receives a flood mode enable signal as an input, the delay block outputs a flood mode write signal to the write circuit, and wherein the write circuit outputs a continuous bitline signal and write signal to the one or more SRAM cells so as to control a write operation of the one or more SRAM cells.

* * * * *